United States Patent
Schmidt

(10) Patent No.: US 11,506,720 B2
(45) Date of Patent: Nov. 22, 2022

(54) DIAGNOSTIC METHOD AND DIAGNOSTIC SYSTEM FOR AN ELECTROCHEMICAL ENERGY STORAGE CELL

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 21 days.

(21) Appl. No.: 17/049,536

(22) PCT Filed: Mar. 29, 2019

(86) PCT No.: PCT/EP2019/058021
§ 371 (c)(1),
(2) Date: Oct. 21, 2020

(87) PCT Pub. No.: WO2019/206562
PCT Pub. Date: Oct. 31, 2019

(65) Prior Publication Data
US 2021/0255250 A1    Aug. 19, 2021

(30) Foreign Application Priority Data
Apr. 26, 2018   (DE) ............ 10 2018 206 505.5

(51) Int. Cl.
*G01R 31/3842* (2019.01)
*G01R 23/165* (2006.01)
(Continued)

(52) U.S. Cl.
CPC ....... *G01R 31/3842* (2019.01); *G01R 23/165* (2013.01); *G01R 31/386* (2019.01);
(Continued)

(58) Field of Classification Search
CPC .......... G01R 31/3842; G01R 23/165; G01R 31/386; G01R 31/389; G01R 31/396; G01R 31/3648; G01R 31/367
See application file for complete search history.

(56) References Cited

U.S. PATENT DOCUMENTS 4,697,134 A * 9/1987 Burkum ............... H02J 7/008
320/134
6,765,388 B1 * 7/2004 Clegg ................. G01R 31/389
324/426
(Continued)

FOREIGN PATENT DOCUMENTS

EP    2 447 728 A1    5/2012
EP    2 530 481 A2    12/2012
(Continued)

OTHER PUBLICATIONS

Howey et al., "Online Measurement of Battery Impedance Using Motor Controller Excitation" IEEE Transactions on Vehicular Technology, vol. 63, No. 6, Jul. 2014 (Year: 2014).*
(Continued)

*Primary Examiner* — John C Kuan
(74) *Attorney, Agent, or Firm* — Crowell & Moring LLP

(57) ABSTRACT

A diagnostic method and a diagnostic system for an electrochemical energy storage cell, and a vehicle including the diagnostic system. An electrical current due to an electrical connection between the energy storage cell and a central load is modulated at a first excitation frequency and is measured centrally. An electrical voltage at the energy storage cell is measured and a first impedance value is determined based on the electrical current and the electrical voltage. Also, a previously-known electrical current due to an electrical connection between the energy storage cell and a predefined cell-individual load is modulated at a second excitation frequency. The electrical voltage occurring at the
(Continued)

energy storage cell is measured and a second impedance value is determined based on the previously-known electrical current and the electrical voltage. Diagnostic information is determined and output based on a comparison of the first impedance value with the second impedance value.

6 Claims, 3 Drawing Sheets

(51) Int. Cl.
    *G01R 31/385* (2019.01)
    *G01R 31/389* (2019.01)
    *G01R 31/396* (2019.01)
    *G01R 31/36* (2020.01)
    *G01R 31/367* (2019.01)

(52) U.S. Cl.
    CPC ......... *G01R 31/389* (2019.01); *G01R 31/396* (2019.01); *G01R 31/367* (2019.01); *G01R 31/3648* (2013.01)

(56) References Cited

U.S. PATENT DOCUMENTS

| | | |
|---|---|---|
| 2012/0310562 A1 | 12/2012 | Van Lammeren et al. |
| 2014/0315047 A1 | 10/2014 | Cattin et al. |
| 2015/0198675 A1 | 7/2015 | Hebiguchi |
| 2017/0113565 A1 | 4/2017 | Lin et al. |

FOREIGN PATENT DOCUMENTS

| | | |
|---|---|---|
| EP | 2 797 157 B1 | 10/2015 |
| KR | 10 2010 0121354 A | 11/2010 |

OTHER PUBLICATIONS

Gong et al., "IC for Online EIS in Automotive Batteries and Hybrid Architecture for High-Current Perturbation in Low-Impedance Cells" 2018 IEEE Applied Power Electronics Conference and Exposition (APEC), Mar. 4-8, 2018 (Year: 2018).*

Varnosfaderani et al., "A Comparison of Online Electrochemical Spectroscopy Impedance Estimation of Batteries" IEEE Access 2018 (Year: 2018).*

International Search Report (PCT/ISA/210) issued in PCT Application No. PCT/EP2019/058021 dated Jul. 8, 2019 with English translation (five (5) pages).

German-language Written Opinion (PCT/ISA/237) issued in PCT Application No. PCT/EP2019/058021 dated Jul. 8, 2019 (six (6) pages).

German-language Search Report issued in German Application No. 10 2018 206 505.5 dated Feb. 12, 2019 with partial English translation (13 pages).

Korean-language Office Action issued in Korean Application No. 10-2020-7028893 dated Jul. 11, 2022 with English translation (nine (9) pages).

* cited by examiner

DIAGNOSTIC METHOD AND DIAGNOSTIC SYSTEM FOR AN ELECTROCHEMICAL ENERGY STORAGE CELL

BACKGROUND AND SUMMARY OF THE INVENTION

The present invention relates to a diagnostic method and a diagnostic system for an electrochemical energy storage cell, particularly a lithium-ion cell, and to a vehicle, particularly a motor vehicle, having such a diagnostic system.

Nowadays, electrochemical energy stores, which are subject to stringent requirements with respect to performance capability and operational security, for example in the context of electromobility, are generally equipped with electronics, which permit a monitoring of the operation of the energy store and even, optionally, of individual energy storage cells which constitute the energy store, such as, for example, lithium-ion cells. For example, the execution of an impedance measurement on the energy store or on an energy storage cell is known, in order to determine the temperature of the energy store or the energy storage cell. The temperature determined can then be employed as a control parameter for the operational management of the energy store wherein, for example, the energy store is cooled, according to the temperature determined, or the power output of the energy store is limited.

One object of the invention is the improvement of the determination of the impedance of an electrochemical energy storage cell, particularly by the improvement of the reliability thereof.

This object is fulfilled by a diagnostic method and a diagnostic system for an electrochemical energy storage cell according to the independent claims. Advantageous embodiments of the invention are the subject matter of the subclaims.

A first aspect of the invention relates to a diagnostic method for an electrochemical energy storage cell, particularly a lithium-ion cell, particularly of an energy store, comprising: (i) modulation of an electric current occurring due to an electrical connection between the energy storage cell and a central load, which is particularly external to the store and/or variable, at a first excitation frequency; (ii) central measurement, particularly externally to the store, of the electric current modulated at the first excitation frequency; (iii) measurement of an electric voltage occurring on the energy storage cell, particularly simultaneously to the modulation and/or measurement of the electric current; (iv) determination of a first impedance value on the basis of the measured electric current and on the basis of the measured electric voltage occurring in particular as a result of the connection of the energy storage cell to the central load; (v) modulation of a previously known electric current occurring due to an electrical connection between the energy storage cell and a predefined cell-specific load, which is particularly assigned to the energy storage cell, at a second excitation frequency; (vi) measurement of an electric voltage occurring on the energy storage cell, particularly simultaneously to the modulation of the previously known electric current; (vii) determination of a second impedance value on the basis of the previously known electric current and on the basis of the measured electric voltage occurring in particular due to the connection of the energy storage cell to the predefined cell-specific load; (viii) determination of diagnostic information on the basis of a comparison of the first impedance value with the second impedance value; and (ix) output of the diagnostic information.

The electric current occurring due to the connection between the energy storage cell, or an energy store containing the energy storage cell, and the central load is preferably modulated directly by the central load itself, or modulation is executed by the electrical connection of the energy storage cell or the energy store to the central load. To this end, the central load can be correspondingly controlled by a central control apparatus, for example an energy store controller. Modulation of the current corresponds to an application of a central excitation to the energy storage cell, on the basis of which the first impedance of the energy storage cell can be determined.

A central load within the meaning of the invention is particularly a load which is external to the store, by means of which all the energy storage cells of the energy store can be loaded simultaneously. A central load can be, for example, an electrical machine, for example for driving a vehicle which is propelled by an electric motor, or a DC voltage converter for connecting an on-board network of the vehicle to the energy store. It is not necessary for the central load to be configured exclusively as an electrical load. Within the meaning of the invention, a central load can also be understood as components which, in specific operating states, can deliver electrical energy to the energy store or to the energy storage cell, for example an electric motor of the vehicle operating in recovery mode.

The control apparatus can also be designed to measure the electric current centrally, i.e. in a singular manner in the cell string comprised of a plurality of energy storage cells of the energy store, for example by means of a current measuring assembly of the control apparatus. Central current measurement of this type is advantageous, on account of its accuracy.

The previously known electric current occurring due to the electrical connection of the predefined cell-specific load with the energy storage cell is preferably modulated by a cell-specific evaluation device, for example an integrated circuit of the energy storage cell, for example by means of a cell-specific switching assembly of the evaluation device. The cell-specific load is thus, in a preferred manner, a constituent, e.g. an electrical component, of the cell-specific evaluation device. Modulation of the current corresponds to an application of a cell-specific excitation to the energy storage cell, on the basis of which the second impedance of the energy storage cell can be determined.

The predefined cell-specific load can be, for example, a shunt, the properties of which are known. In particular, the magnitude of the electric current flowing due to the electrical connection of the cell-specific load with the energy storage cell can thus be previously known, or can at least be inferred from the known properties. In order to determine the second impedance of the energy storage cell in a cell-specific manner, it is consequently only necessary for the voltage occurring on the energy storage cell to be measured.

In general, the first impedance can be determined with greater precision than the second impedance, as the electric current determined by central measurement, for example by means of the control apparatus which is external to the store, is known with a higher degree of accuracy than the electric current which is previously known by reference to the predefined cell-specific load. Accordingly, the second impedance determined, in the context of the comparison, for example by the constitution of a ratio or a differential, can be advantageously validated by the first impedance determined.

The diagnostic information output permits a reliable monitoring of the impedance measurements on the energy storage cell. The diagnostic information can include, for example, a measure of the deviation of the second impedance determined from the first impedance determined. In this case, if the deviation achieves or exceeds a predefined deviation threshold value, this can be interpreted, for example, as an indication of a malfunction of the cell-specific evaluation device of the energy storage cell and, optionally, also of the central control apparatus, and a corresponding maintenance instruction can be generated. Alternatively or additionally, the operation of the energy storage cell can at least be restricted, for example by the limitation of power output, in order to reduce the risk of damage to the energy storage cell resulting from operational management which is based upon a potentially unreliably determined temperature.

The diagnostic information output particularly permits functionalities for current measurement, current generation and voltage measurement, which are necessary for the operation of the energy storage cell, and particularly of the energy store incorporating the energy storage cell, to be monitored at cell level, or permits the identification of malfunctions, such that any corresponding countermeasures or repair measures can be implemented. This not only improves the reliability of the energy storage cell or the energy store, but also increases the service life thereof.

Overall, the invention permits an improved determination of the impedance of an electrochemical storage cell, and particularly permits a more reliable determination.

Preferred forms of embodiment of the invention and further developments thereof are described hereinafter, each of which, unless expressly excluded, can be arbitrarily combined, both with one another and with the further aspects of the invention described.

In a preferred form of embodiment, the diagnostic information is taken into account in the context of at least one future measurement of an electric voltage occurring on the energy storage cell due to the electrical connection of the energy storage cell with the predefined cell-specific load. Preferably, the cell-specific evaluation device, which is designed for measuring the electric voltage which occurs on the energy storage cell, is calibrated on the basis of the diagnostic information. To this end, in the context of the comparison of the first impedance with the second impedance, a corrective factor can be determined, which constitutes the diagnostic information or is at least an element of the diagnostic information. This permits a reliable and accurate cell-specific determination of the impedance of the energy storage cell, after the method according to the invention has been executed at least once.

In a further preferred form of embodiment, the measured electric current and/or the measured electric voltage are/is filtered with respect to the excitation frequency. Preferably, for example by means of the central control apparatus and/or by means of the cell-specific evaluation device, a Fourier decomposition of the measured electric current and/or the measured electric voltage is executed, and that Fourier coefficient for the determination of the first or second impedance is selected which corresponds to the first or second excitation frequency. As a result, any uncertainty in the determination of the first and/or the second impedance can be reduced.

Alternatively, for the determination of current or voltage components which contribute to the impedance at the first or second excitation frequency, e.g., also an orthogonal correlation (modulator/demodulator) can be applied to the measured current and/or the measured voltage. It is also conceivable that the Goertzel algorithm or other filtering structures might be applied in order, in each case, to obtain only the Fourier coefficient for the respective excitation frequency from the measured current or the measured voltage.

In a further preferred form of embodiment, the second excitation frequency is selected to be at least essentially equal to the first excitation frequency, and the previously known electric current occurring due to the electrical connection of the energy storage cell with the cell-specific load is not modulated until the electric current occurring due to the electrical connection of the energy storage cell with the central load has been modulated beforehand. In particular, the method according to the invention, in this form of embodiment, can be executed at least once at the start of operation of the energy storage cell, for example upon the start-up of an electric motor-driven vehicle which incorporates the energy store containing the energy storage cell. By reference to the diagnostic information obtained, in this manner, subsequent impedance measurements by means of the cell-specific evaluation device with the energy storage cell in-service, for example during the travel of the vehicle, can be executed more accurately.

In a further preferred form of embodiment, the second excitation frequency is selected to be different from the first excitation frequency, and the electric current occurring due to the electrical connection of the energy storage cell with the predefined cell-specific load is modulated, at least essentially, simultaneously with the modulation of the electric current occurring due to the electrical connection of the energy storage cell with the central load. Voltages and/or currents occurring due to simultaneous modulation at different excitation frequencies are preferably assigned to the central or the cell-specific load by means of a filtering method, particularly by Fourier decomposition, such that the first and second impedance can be determined simultaneously, but nevertheless independently of one another. In particular, the method according to the invention, in this form of embodiment, can be executed at least once during the routine operation of the energy storage cell, for example during the travel of an electric motor-driven vehicle which incorporates an energy store containing an energy storage cell. Preferably, the method is executed at predefined intervals, for example at predefined time intervals or after the completion of predefined distances by the vehicle. Accordingly, in particular, a cell-specific impedance measurement can be monitored over the entire duration of operation of the energy storage cell and, in particular, the cell-specific evaluation device can be regularly calibrated on the basis of the diagnostic information.

In a preferred manner, the first excitation frequency differs only slightly from the second excitation frequency, for example by a maximum of 1 kHz, preferably by a maximum of 100 Hz, further preferably by a maximum of 10 Hz, and particularly by a maximum of 2 Hz. It can thus be ensured that the first and second impedance determined remain mutually comparable, and that the diagnostic information, for example, permits a reliable monitoring, particularly of the cell-specific impedance measurements.

A second aspect of the invention relates to a diagnostic system for an electrochemical energy storage cell, which is designed to execute a diagnostic method according to the first aspect of the invention.

In a preferred embodiment, a diagnostic system comprises a central and optionally variable load for the modulation of the optionally variable electric current occurring due to an electrical connection of the energy store with the central load, at a first excitation frequency, and a central current measuring assembly for the central measurement of this optionally variable electric current. In a preferred manner, the central load is controllable by means of a central control apparatus. In particular, modulation of the electric current by the external load can be controlled by the central control apparatus. Alternatively or additionally, the central current measuring assembly is an element of the central control apparatus, particularly of an energy store controller. In particular, the diagnostic system, for each cell string of a plurality of energy storage cells, comprises only one central current measuring assembly, wherein the modulated electric current flowing as a result of the electrical connection of the energy store with the central load simultaneously executes an excitation function on all the energy storage cells, and can be measured.

In a preferred manner, the diagnostic system further comprises a cell-specific switching assembly for the modulation of the previously known electric current occurring due to the electrical connection of the energy storage cell with a predefined cell-specific load, at a second excitation frequency. Furthermore, the diagnostic system preferably comprises a cell-specific voltage measuring assembly for the measurement of an electric voltage which occurs on the energy storage cell. The cell-specific voltage measuring assembly can particularly be designed for measuring an electric voltage occurring on the energy storage cell due to the electrical connection of the energy storage cell with the central load. Alternatively or additionally, the cell-specific voltage measuring assembly can be designed for measuring an electric voltage occurring on the energy storage cell due to the electrical connection of the energy storage cell with the predefined cell-specific load.

In a preferred manner, the cell-specific switching assembly and the cell-specific voltage measuring assembly are elements of a cell-specific evaluation device, particularly of an integrated circuit, which can be arranged in, on, or in the immediate vicinity of the cells.

The central control apparatus, particularly a central energy store control device, can thus be designed to determine a first impedance value on the basis of the centrally measured electric current and of the measured electric voltage, particularly in the event of the electrical connection of the energy storage cell with the central load. The cell-specific evaluation device can moreover be designed to determine a second impedance on the basis of the previously known electric current and of the measured electric voltage, particularly in the event of the electrical connection of the energy storage cell with the cell-specific load.

In a further preferred form of embodiment, the central control apparatus, particularly the current measuring assembly, is designed to output an amplitude of the measured current occurring due to the electrical connection of the energy storage cell with the central load to the cell-specific evaluation device. In a preferred manner, the cell-specific evaluation device is thus designed, additionally to the second impedance value, to further determine the first impedance value on the basis of the amplitude of the electric current output by the central control apparatus, particularly by the current measuring assembly, and of the measured electric voltage, particularly in the event of the electrical connection of the energy storage cell with the central load. Accordingly, the diagnosis of the, particularly cell-specific, impedance measurement can be executed by the cell-specific evaluation device, particularly on the integrated circuit of the energy storage cell, thereby economizing resources in the central control apparatus.

A third aspect of the invention relates to a vehicle, particularly a motor vehicle, having an electrical energy storage cell and a diagnostic system according to the second aspect of the invention. A vehicle of this type, particularly on account of the monitoring of impedance measurements on the electrical energy storage cell by the diagnostic system, can be operated in a particularly secure manner.

The features and advantages described with reference to the first aspect of the invention, and the advantageous configuration thereof, are also applicable, insofar as is technically rational, to the second and third aspects of the invention and the advantageous configuration thereof, and vice versa.

Further features, advantages and possibilities for the application of the invention proceed from the following description, in conjunction with the figures in which, throughout, the same reference symbols are employed for the same or mutually corresponding elements of the invention. In the figures, in an at least partially schematic representation:

DETAILED DESCRIPTION OF THE DRAWINGS

Figure 1:
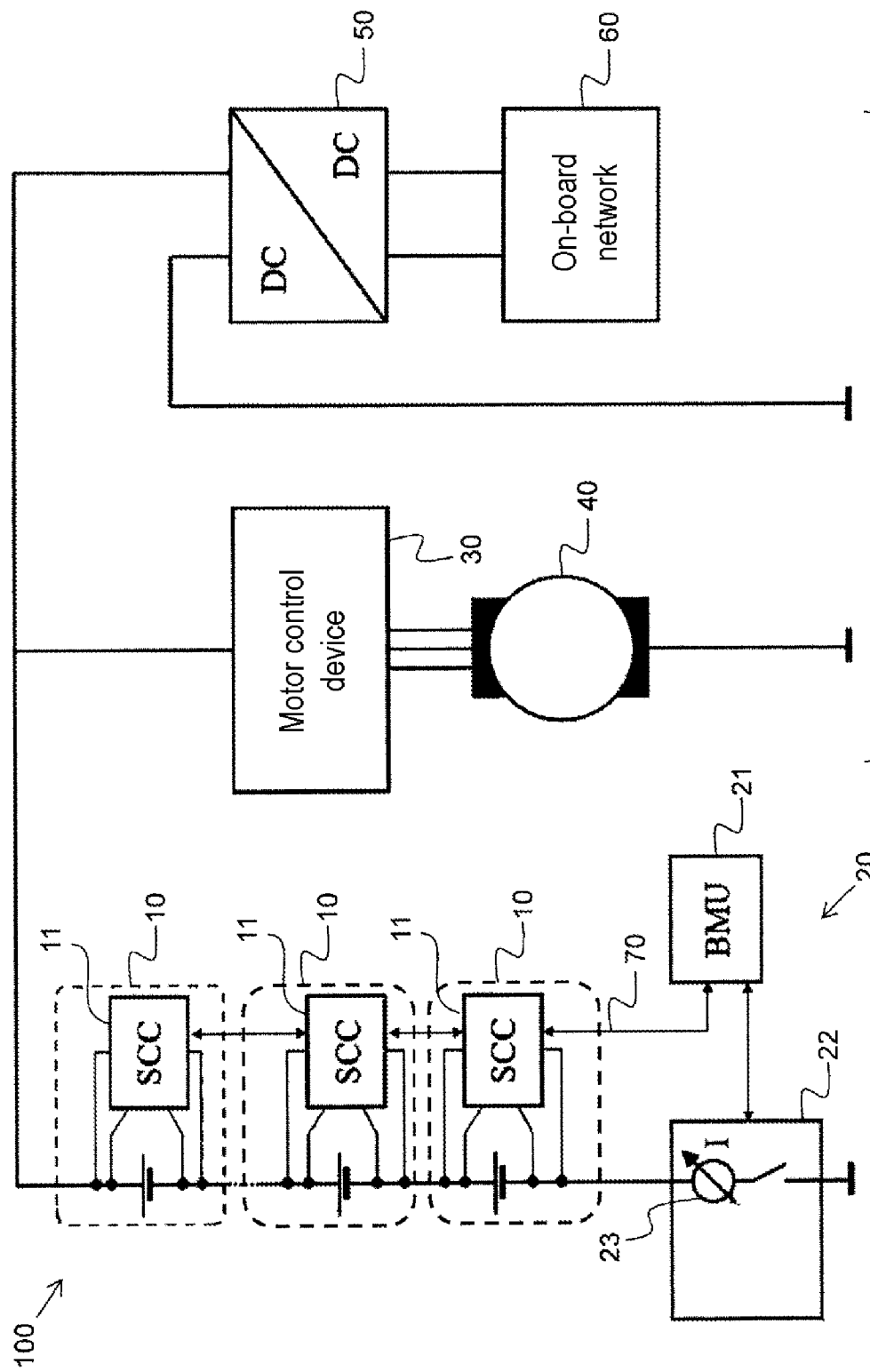
FIG. 1 shows a diagnostic system according to the invention for an electrochemical energy storage cell.

FIG. 1 shows a diagnostic system 100 according to the invention for electrochemical energy storage cells 10, each having a cell-specific evaluation device 11 (single cell chip, or SCC; also known as a single cell monitor, or SCM) and a central control apparatus 20. The energy storage cells 10 are series-connected and, in combination, constitute an electrochemical energy store which, for example, supplies a vehicle with electrical energy. To this end, the electrochemical energy store, as represented in an exemplary manner, can be integrated in a high-voltage region of a vehicle network of the vehicle. In particular, the energy store is electrically connected to a motor control device 30 or to an inverter, in order to deliver DC supplied by the energy storage cells 10 in the form of AC to an electrical machine 40, for example to an electric motor for driving the vehicle. The energy store is also electrically connected to a DC voltage converter 50, which delivers the DC supplied at a lower voltage in an on-board network 60 of the vehicle.

The motor control device 30 or the electrical machine 40, or the DC voltage converter 50 or the on-board network 60 which, in the routine operation of the vehicle, draw electrical energy from the energy store, in a preferred manner, constitute a central load 80. The central load 80 is thus variable, particularly according to the operating state of the vehicle. According to the invention, the flow of electric current associated with this loading of the energy storage cells 10 is modulated by the central load 80.

The preferably high-frequency modulation is executed at a first excitation frequency. Accordingly, the central load 80, i.e. the motor controller 30 or the DC voltage converter 50 can be prompted to modulate the current at the first excitation frequency by a central energy store control device 21 (battery monitoring unit or BMU) of the control apparatus 20. The central loading of the energy storage cells 10 generated in this manner corresponds to an excitation, on the basis of which an impedance of the energy storage cells 10 can be centrally determined.

For the determination of the impedance, the control apparatus 20 comprises a current measuring assembly 23, which is designed to measure the electric current I occurring due to the electrical connection of the energy storage cells 10 with the central load 80. In the example represented, the current measuring assembly 23 is integrated in a central power contactor 22 of the control apparatus 20, for example on a circuit board.

The electric voltage, which is also necessary for the determination of the impedance, which is present on the energy storage cells 10 in the event of the electrical connection with the central load 80, is measured in each case on or in each of the energy storage cells 10 by the corresponding evaluation device 11. An evaluation device 11 of this type can be configured, for example, as a chip, which is designed to measure the electric voltage occurring on the respective energy storage cell 10. The impedance determined on the basis of the measured electric current and the measured electric voltage is also described as the first impedance.

The voltage value determined can be transmitted, for example via a data link 70, to the central energy store control device 21 of the control apparatus 20. In this case, the first impedance can be determined by the control apparatus.

Alternatively, the first impedance for each of the energy storage cells 10 can also be determined, in each case, by the cell-specific evaluation device 11. To this end, the electric current measured by the current measuring assembly 23 is transmitted via the data link 70 to the evaluation devices 11.

In order to improve the accuracy of this first impedance measurement, which is executed by means of central excitation, the measured electric current and the measured electric voltage can be filtered with respect to the first excitation frequency, for example by means of a Fourier decomposition. This filtering, at least in part, can be executed by the control apparatus 20. Alternatively, however, the filtering can also be executed, at least in part, by the evaluation device 11.

Preferably, the evaluation devices 11 are not only designed to determine electric voltages occurring in the event of the electrical connection of the energy storage cells 10 with the central load 80, but also to directly determine a second, cell-specific impedance of the respective energy storage cell 10. To this end, the evaluation devices 11 can modulate a previously known electric current, occurring due to an electrical connection of the respective energy storage cell 10 with a respectively predefined cell-specific load, for example a shunt of the evaluation device 11, and measure the electric voltage occurring on the respective energy storage cell 10.

The preferably high-frequency cell-specific modulation is executed at a second excitation frequency. The loading of the energy storage cell 10 generated in this manner corresponds to an excitation, on the basis of which the impedance of the energy storage cells 10 can be determined in a cell-specific manner.

In evaluation devices 11 of this design, in order to output a pure voltage value on the control apparatus 20 for the central determination of impedance, the evaluation devices 11 can be configured such that, in the context of the cell-specific determination of impedance, not only the predefined electric current corresponding to the predefined cell-specific load is considered, but also an electric current of 1 A is assumed. The impedance $Z=U/1$ A thus determined by the evaluation device 11 will then correspond directly to the electric voltage occurring on the respective energy storage cell 10.

The control apparatus 20, particularly the central energy store control device 21, is preferably designed to compare the first impedance, which is centrally determined by the control apparatus 20, with each second impedance which is respectively determined by each of the evaluation devices in a cell-specific manner and, on the basis of the comparison, to constitute and output diagnostic information with respect to the impedance measurements. Given that, for the first impedance measurement, the electric current occurring due to central loading is accurately measured by means of the current measuring assembly 23 whereas, for each of the second impedance measurements, the predetermined electric current occurring due to cell-specific loading is only assumed, the first impedance measurement can be considered to be more reliable, and the second impedances determined can therefore be validated by reference to the first impedance determined. Optionally, the evaluation devices 11 can also be calibrated by means of the diagnostic information, in order to improve the reliability of future cell-specific impedance measurements by the evaluation devices 11, for example during the operation of the vehicle.

Figure 2:
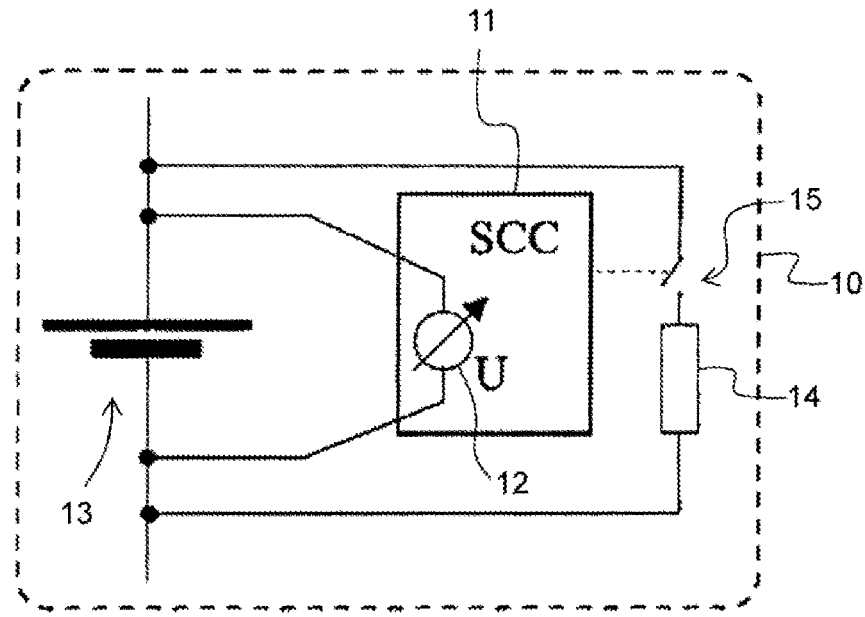
FIG. 2 shows an electrochemical energy storage cell having a cell-specific evaluation device.

FIG. 2 shows an electrochemical energy storage cell 10 having a cell-specific evaluation device 11, which incorporates a voltage measuring assembly 12 for measuring an electric voltage U occurring due to an electrical connection of the energy storage cell 10, particularly of an electrode assembly 13, with a predefined cell-specific load 14. The evaluation device 11 further comprises a cell-specific switching assembly 15 for the modulation of the previously known electric current occurring during the electrical connection. Both the current measuring assembly 12 and the cell-specific load 14 and/or the cell-specific switching assembly 15 can be constituents of the evaluation device 11, particularly of an integrated circuit or chip.

The evaluation device 11, as described in detail with reference to FIG. 1, is designed to execute a cell-specific impedance measurement. Alternatively or additionally, the evaluation device 11 can be designed, as also described with reference to FIG. 1, to measure an electric voltage occurring due to the electrical connection of the energy storage cell 10 with a central load, thereby also permitting a determination of the impedance by reference to an external and centrally-injected current.

Figure 3:
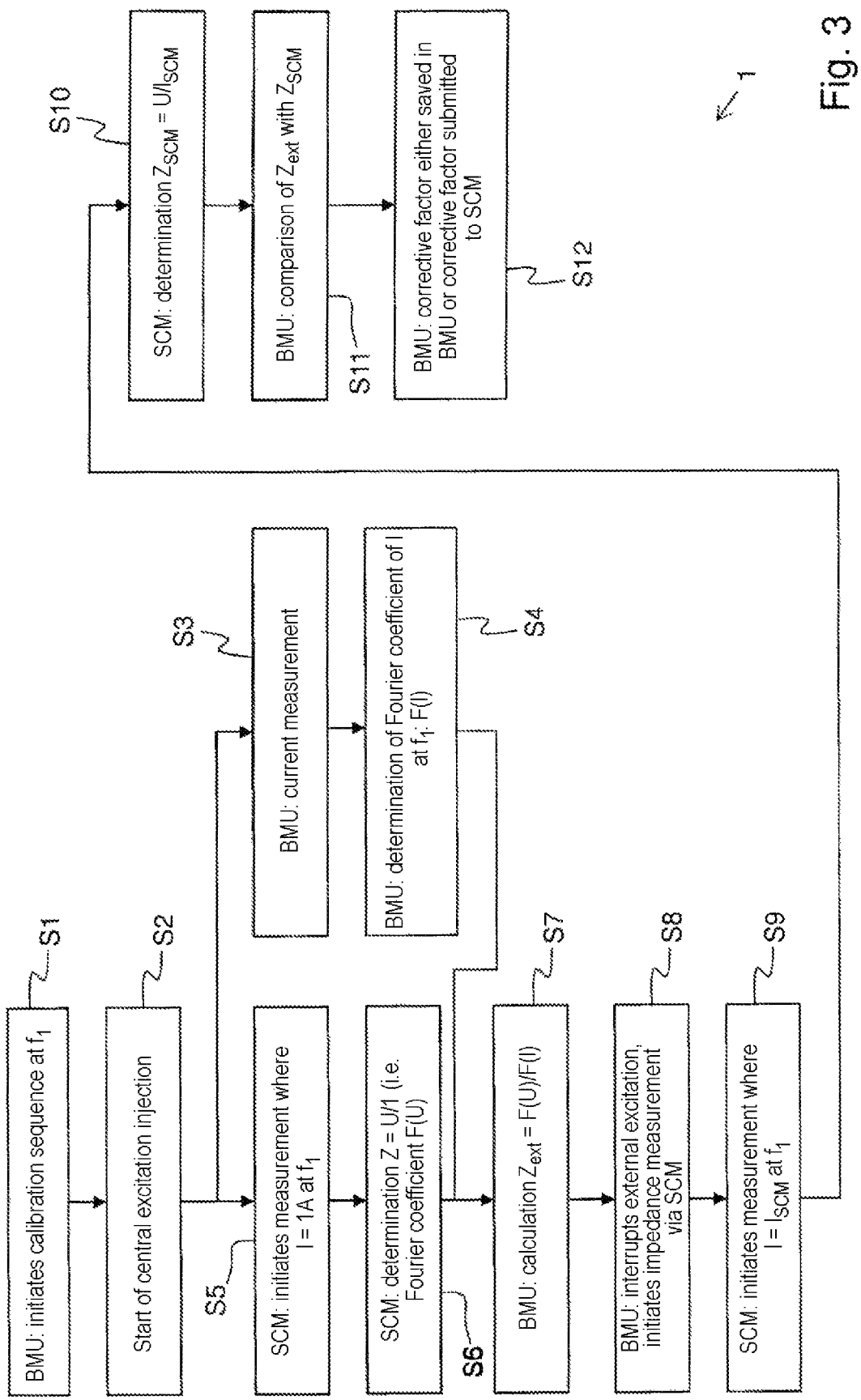
FIG. 3 shows a diagnostic method according to the invention for an electrochemical energy storage cell, in a first embodiment.

FIG. 3 shows a diagnostic method 1 according to the invention for an electrochemical energy storage cell, in a first form of embodiment. By means of the diagnostic method 1, for example, a cell-specific impedance measurement can be validated and/or a corresponding measuring assembly can be calibrated.

In a process step S1, a central energy store control device (battery monitoring unit or BMU) of a control apparatus of an electrochemical energy store, which incorporates the energy storage cell, initiates the method 1, particularly a calibration sequence, for example by the output of a starting signal to a central switching assembly of the control apparatus. This calibration sequence is preferably executed prior to the start of operation of the energy storage cell.

In a process step S2, this switching assembly modulates an electric current occurring due to an electrical connection of a central, particularly a variable, load with the energy storage cell at a first excitation frequency $f_1$ which is dictated by the energy store control device. The modulation imposes a central excitation upon the energy storage cell, on the basis of which a first impedance $Z_{ext}$ can be determined in a subsequent process step S7.

In a further process step S3, by means of a current measuring assembly of the control apparatus, an electric current I occurring due to the connection is measured. At least essentially simultaneously, in a process step S5, by means of a cell-specific evaluation device (single cell monitor, or SCM; also known as a single cell chip, or SCC), which is designed for the cell-specific determination of a second impedance $Z_{SCM}$ in a subsequent process step S10, initiates an impedance measurement under the assumption of an electric current flow of 1 A, associated with central excitation which is external to the store.

In subsequent process steps S4, S6, firstly, the measured electric current I can be filtered by the central energy store control device, for example wherein a Fourier coefficient F of the electric current I is determined at the first excitation frequency $f_1$ and, secondly, the electric voltage measured in the form of the impedance Z=U/1 can be filtered by the evaluation device, for example wherein a Fourier coefficient F of the electric voltage U is determined at the first excitation frequency $f_1$.

The first impedance $Z_{ext}$ can be determined by the central control apparatus, where the voltage measured by the evaluation device is delivered to the central control apparatus. However, it is also possible for the injected current, particularly the current measured by means of the current measuring assembly, to be delivered to the cell-specific evaluation device, such that the first impedance $Z_{ext}$ can be determined directly by the evaluation device.

After the calculation of the first impedance $Z_{ext}$ on the basis of the Fourier coefficients F for the electric current I and the electric voltage U determined in process step S7, the central excitation is interrupted in the further process step S8, and a cell-specific impedance measurement for determining the second impedance $Z_{SCM}$ is initiated. By modulation of a previously known current $I_{SCM}$ occurring due to the electrical connection of the energy storage cell with a predefined, i.e. constant, cell-specific load, a cell-specific excitation is imposed upon the energy storage cell at a second excitation frequency which, in this form of embodiment, corresponds to the first excitation frequency $f_1$. The resulting electric voltage U is measured in process step S10, and is correlated with the previously known electric current $I_{SCM}$ to give the cell-specific second impedance $Z_{SCM}$.

The second impedance $Z_{SCM}$ thus determined is preferably transmitted to the central energy store control device where, in process step S11, it is compared with the previously determined first impedance $Z_{ext}$. In the context of the comparison, diagnostic information, for example a corrective factor, is determined and output, for example saved in the central energy store control device or transmitted to the evaluation apparatus, in order to permit the correction of future cell-specific impedance measurements.

Figure 4:
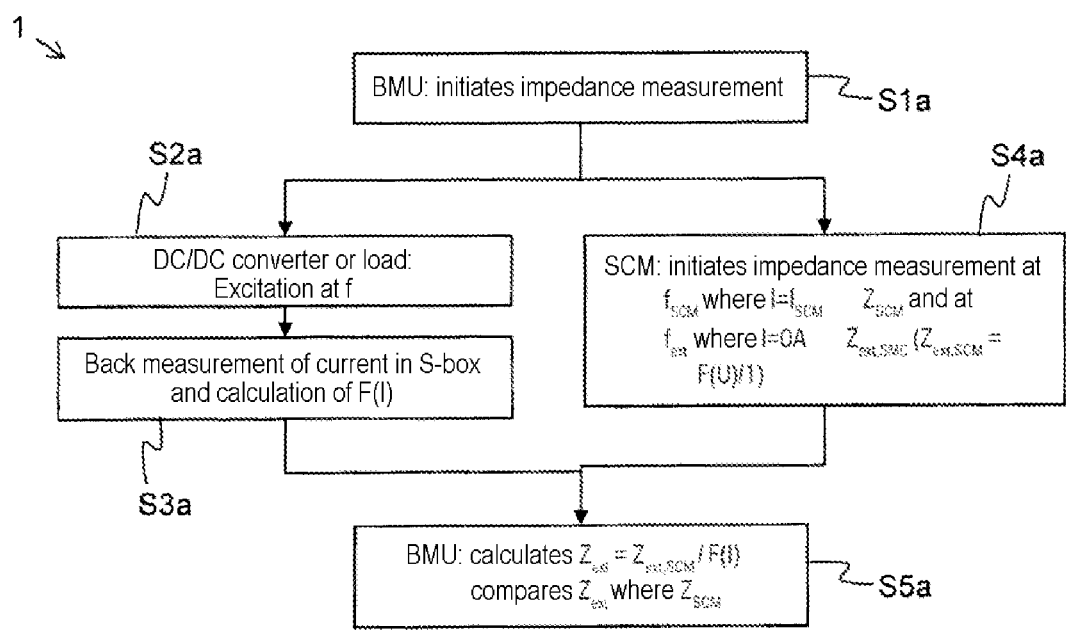
FIG. 4 shows a diagnostic method according to the invention for an electrochemical energy storage cell, in a second embodiment.

FIG. 4 shows a diagnostic method 1 according to the invention for an energy storage cell, in a second form of embodiment. In an analogous manner to the form of embodiment described in conjunction with FIG. 3, an impedance measurement is initiated by a central energy store control device of a control apparatus for an energy store, which incorporates the energy storage cell, in a process step S1a, for example during the operation of a vehicle, during which electrical energy is drawn from the energy store or the energy storage cell.

In a further process step S2a, a switching assembly of the control apparatus modulates the electric current I occurring due to an electrical connection of the energy storage cell with a central load, which is external to the store, at a first excitation frequency $f_1$. In a subsequent process step S3a, the electric current I occurring is measured by a current measuring assembly of the control apparatus, and is filtered, for example a Fourier coefficient F is calculated at the first excitation frequency $f_1$.

At least essentially simultaneously, in a further process step S4a, a cell-specific impedance measurement is initiated by an evaluation device of the energy storage cell, wherein a previously known current flowing as a result of the electrical connection of the energy storage cell with a predefined cell-specific load is modulated at a second excitation frequency $f_2$, which differs from the first excitation frequency $f_1$. A measurement of the likewise occurring electric voltage U therefore permits the evaluation device to determine a second impedance $Z_{SCM}$ on the basis of the previously known electric current $I_{SCM}$ and the measured electric voltage U.

In this form of embodiment, process step S4a also includes the determination of an electric voltage U occurring due to the electrical connection of the energy storage cell with the central load. To this end, as described in detail in conjunction with FIG. 3, an electric current flow of 1 A is assumed, such that the impedance $Z_{ext,SCM}$ determined by the evaluation device corresponds directly to the electric voltage U occurring.

In order to permit the mutual distinction or separation of the contributions to the measured electric voltage U, firstly due to the electrical connection of the energy storage cell to the central load, and secondly due to the electrical connection of the energy storage cell with the cell-specific load, the measured electric voltage U is filtered, particularly by the decomposition of Fourier coefficients F at the first excitation frequency $f_1$ and the second excitation frequency $f_2$. On the basis of the Fourier coefficient F of the voltage U at the second excitation frequency $f_2$ and the previously known electric current $I_{SCM}$, the second impedance $Z_{SCM}$ can be determined by the evaluation device. On the basis of the Fourier coefficient F of the voltage U at the first excitation frequency $f_1$, the impedance $Z_{ext,SCM}$ corresponding to the electric voltage U associated with excitation at the first excitation frequency $f_1$ can be determined by the evaluation device, on the basis of which, in a further process step S5a, in consideration of the electric current I determined or the Fourier coefficient F thereof, at the first excitation frequency $f_1$, the first impedance $Z_{ext}$ can be determined by the central energy store control device. The first impedance $Z_{ext}$ and the second impedance $Z_{SCM}$ are compared with one another, for example in order to validate the measured cell-specific impedance $Z_{SCM}$.

Whilst at least one exemplary form of embodiment has been described heretofore, it should be observed that a large number of variations thereof exist. It should also be observed that the exemplary forms of embodiment described only represent non-limiting examples, and are not intended to restrict the scope, the applicability or the configuration of the devices and methods described herein. Instead, the preceding description is intended to provide a person skilled in the art with instruction in the implementation of at least one exemplary form of embodiment, wherein it is understood that different variations in the mode of operation and the arrangement of elements described in an exemplary form of embodiment can be undertaken, without departing from the subject matter which is respectively established in the attached claims, or from any legal equivalents thereof.

LIST OF REFERENCE SYMBOLS

1 Diagnostic method
S1-S12 Process steps
S1a-S5a Process steps
10 Energy storage cell
11 Evaluation device
12 Voltage measuring assembly
13 Electrode assembly
14 Cell-specific load
15 Cell-specific switching assembly
20 Control apparatus
21 Central energy store control device
22 Central power contactor
23 Current measuring assembly
30 Motor control device/inverter
40 Electrical machine
50 DC voltage converter
60 On-board network
70 Data link
80 Central load
100 Diagnostic system
U Electric voltage
I Electric current
$I_{SCM}$ Previously known electric current
F Fourier coefficient
$Z_{ext,SCM}$ Impedance corresponding to the measured voltage
$Z_{ext}$ First impedance
$Z_{SCM}$ Second impedance
$f_1$ First excitation frequency
$f_2$ Second excitation frequency

What is claimed is:

1. A diagnostic method for an electrochemical energy storage cell, the method comprising:
    modulating, at a first excitation frequency, a first electric current occurring due to an electrical connection between the energy storage cell and a central load;
    measuring a modulated electric current resulting from the modulating of the first electric current;
    measuring a first electric voltage present on the energy storage cell;
    determining a first impedance value based on the modulated electric current and the first electric voltage;
    modulating, at a second excitation frequency, a previously known second electric current occurring due to an electrical connection between the energy storage cell and a predefined cell-specific load;
    measuring a second electric voltage present on the energy storage cell;
    determining a second impedance value based on the previously known second electric current and the second electric voltage;
    determining diagnostic information based on a comparison of the first impedance value with the second impedance value; and
    outputting the diagnostic information;
    wherein the second excitation frequency is selected to differ from the first excitation frequency, and the previously known second electric current occurring due to the electrical connection of the energy storage cell with the predefined cell-specific load is modulated simultaneously with the modulation of the first electric current occurring due to the electrical connection of the energy storage cell with the central load.

2. The diagnostic method according to claim 1, wherein the diagnostic information is taken into account in the context of at least one future measurement of an electric voltage occurring on the energy storage cell due to the electrical connection of the energy storage cell with the predefined cell-specific load.

3. The diagnostic method according to claim 1, wherein at least one of the first electric current and the first electric voltage is filtered with respect to the first or second excitation frequency.

4. A diagnostic system for an electrochemical energy storage cell which is designed to execute a diagnostic method, the diagnostic system comprising:
    a controller configured to control a cell-specific evaluation device to
        modulate, at a first excitation frequency, a first electric current occurring due to an electrical connection between the energy storage cell and a central load;
        measure a modulated electric current resulting from the modulating of the first electric current;
        measure a first electric voltage present on the energy storage cell;
        determine a first impedance value based on the modulated electric current and the first electric voltage;
        modulate, at a second excitation frequency, a previously known second electric current occurring due to an electrical connection between the energy storage cell and a predefined cell-specific load;
        measure a second electric voltage present on the energy storage cell;
        determine a second impedance value based on the previously known second electric current and the second electric voltage;
        determine diagnostic information based on a comparison of the first impedance value with the second impedance value; and
        output the diagnostic information;
    wherein the second excitation frequency is selected to differ from the first excitation frequency, and the previously known second electric current occurring due to the electrical connection of the energy storage cell with the predefined cell-specific load is modulated simultaneously with the modulation of the first electric current occurring due to the electrical connection of the energy storage cell with the central load.

5. The diagnostic system according to claim 4, comprising:
    a central current measuring assembly configured to measure the first electrical current occurring due to the electrical connection of the energy storage cell with the central load; and
    the cell-specific evaluation device configured to determine the second impedance value based on the previously known second electric current and the second electric voltage;
    wherein the central current measuring assembly is designed to output an amplitude of the first electric current occurring due to the electrical connection of the energy storage cell with the central load to the cell-specific evaluation device, and the cell-specific evaluation device is designed, additionally to the second impedance value, to further determine the first impedance value based on the amplitude of the first electric current output by the central current measuring assembly and an amplitude of the first electric voltage.

6. A motor vehicle having an electrical energy storage cell and a diagnostic system according to claim 4.

* * * * *